United States Patent [19]

Guarino

[11] Patent Number: 4,777,372
[45] Date of Patent: Oct. 11, 1988

[54] RIGHT ANGLE DRIVING

[75] Inventor: Nicholas Guarino, Arlington, Mass.

[73] Assignee: Micrion Limited Partnership, Beverly, Mass.

[21] Appl. No.: 861,143

[22] Filed: May 8, 1986

[51] Int. Cl.[4] ................................................ G21K 5/10
[52] U.S. Cl. .................................. 250/442.1; 269/50; 269/51
[58] Field of Search ............ 250/440.1, 442.1, 452.21, 250/398; 414/8, 292; 269/50, 51

[56] References Cited

U.S. PATENT DOCUMENTS

| | | | |
|---|---|---|---|
| 2,499,019 | 2/1950 | Dornfeld | 250/442.1 |
| 3,648,048 | 3/1972 | Cahan et al. | 250/442.1 |
| 4,274,004 | 6/1981 | Kanai | 250/442.1 |
| 4,447,731 | 5/1984 | Kuni et al. | 250/442.1 |
| 4,516,029 | 5/1985 | Tucker | 250/442.1 |
| 4,587,431 | 5/1986 | Uemura | 250/442.1 |

Primary Examiner—Bruce C. Anderson
Attorney, Agent, or Firm—Charles Hieken

[57] ABSTRACT

A platform for positioning inside an evacuated chamber is slidable in a y—y direction along a movable support member that is movable along an x—x direction perpendicular to the y—y direction. The movable support member is formed with end bearings that ride along a y-drive shaft that carries a first helical gear for meshing with a second orthogonal helical gear that rotates a feed screw accommodated by a threaded opening in the platform. An electric motor is coupled to the y-drive shaft through the wall of the evacuated housing with a vacuum sealing assembly.

9 Claims, 5 Drawing Sheets $$\Sigma F_N \cos\theta\,(a) = \text{TORQUE APPLIED}$$

RIGHT ANGLE DRIVING

The present invention relates in general to right angle driving and more particularly concerns novel apparatus and techniques for effecting translation perpendicular to a direction of translation parallel to a common axis of drive shafts for effecting translation in both orthogonal directions. The invention is especially advantageous in connection with precisely positioning a platform in an evacuated chamber, such as used for processing substrates with an ion beam.

It is possible to repair defective masks and integrated circuits by appropriately energizing the defective area with an ion beam. However, identifying and correcting defects requires precise positioning of the defective mask or circuit in an evacuated chamber. Positioning is typically accomplished by mechanically displacing a supporting platform in orthogonal x and y directions. Typically these directions are referred to as x and y. It is possible to have one motor on the platform inside the chamber with the other motor outside the chamber driving the shaft. This approach is disadvantageous for a number of reasons. The motor has a magnetic field which may disturb the precise positioning of the ion beam. The motor occupies space in the evacuated chamber that may require an increase in the size of the chamber and a corresponding increase in weight and cost of the structure itself and associated apparatus for creating and maintaining the vacuum. The motor generates heat that can cause thermal expansion of the platform and the mask or circuit, leading to inaccuracies in the placement of the ion beam on the mask or circuit.

The specific application of the invention for repairing defective masks and integrated circuits with an ion beam requires accurate, precise and repeatable positioning of the substrate under the beam. This requirement is generally true when the substrate is stationary (i.e., move the substrate to a given location and maintain its position without any spurious motion), and when the substrate is moving (i.e., move the substrate under the beam in some continuous manner without spurious motions).

Furthermore, ion beam and electrom beam systems require that their interaction with the substrates (photomasks or wafers) occur in a vacuum. This requirement further exacerbates the problems because materials, structural design and lubricants must be compatible with the vacuum environment, typically within the $10^{-7}$ to $10^{-8}$ Torr pressure range. The drive system should be free of random forces which could cause unwanted motions of the substrate.

A conventional prior art drive system uses a motor on each axis. Typically, when the x motor drives the system in the x direction, the y table and its motor mounted thereon move in the x direction. The y motor drives the y table in the y direction. While this approach is acceptable for applications in air at atmospheric pressure, there are difficulties indicated above when the table is located in a vacuum environment.

There are a number of prior art approaches for locating the y drive motor outside the vacuum. For example, one arrangement uses a helical gear pair to reorient the axis of the y drive motor 90 degrees and parallel to the x axis drive motor with the y drive motor shaft passing through a sliding vacuum seal and free to move in the x direction in response to being driven by the x motor. A disadvantage of this approach is that the sliding seal and motor mount are complex and have a tendency to influence the x motion because of seal friction and inertia. Furthermore, variation of the magnetic field as the y motor translates could adversely affect some applications, such as electron beam systems.

Accordingly, it is an important object of this invention to provide improved methods and means for right angle driving.

According to the invention, there is platform means for supporting an item to be positioned, and sliding support means for supporting said platform means while allowing relative displacement in a first direction. There is movable support means for supporting the slidable support means that is movable along a second direction substantially perpendicular to the first direction. There is means for translating the movable support means along said second direction, and stationary rotatable shaft means passing through said movable support means and coupled to said platform means for producing a rotation that causes said platform means to translate along said first direction. In a specific form of the invention when used in an evacuated chamber, the rotating means may comprise a shaft passing through a vacuum seal in the wall of the evacuated chamber and driven by an electric motor outside the chamber.

Numerous other features, objects and advantages of the invention will become apparent from the following specification when read in connection with the accompanying drawing in which.

Figure 1:
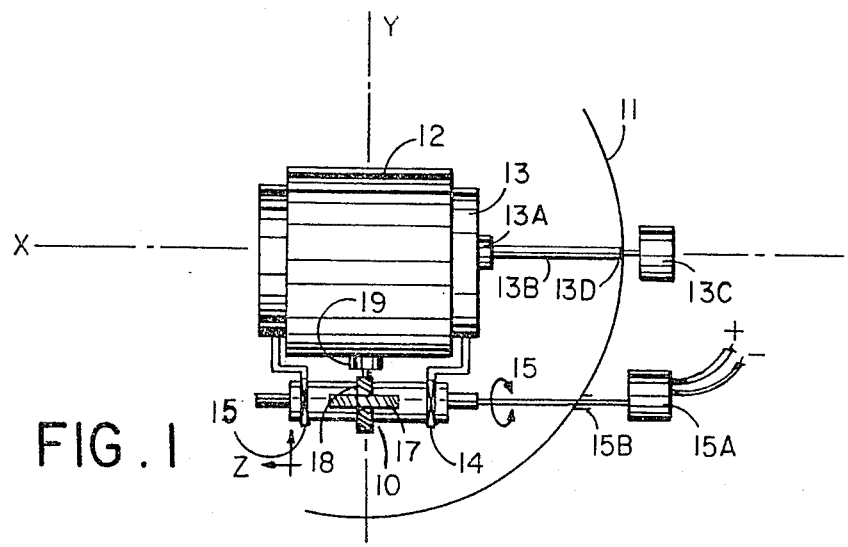
FIG. 1 is a diagrammatic plan view of an embodiment of the invention.

With reference now to the drawing and more particularly FIG. 1 thereof, there is shown a diagrammatic plan view of an embodiment of the invention with most of the evacuated chamber wall 11 cut away. Support platform 12 is slidably supported for y movement along movable support 13 movable along the x direction. Movable support 13 has its own means of support, such as internally threaded sleeve 13A that rides on lead screw 13B driven by x motor 13C whose shaft passes through a vacuum rotary seal 13D.

Movable support 13 includes support bearings 14 and 14A for rotatably supporting rotatable housing 10 to which annular helical gear 16 is attached for meshing with helical gear 17 that rotates lead screw 18 that engages internally threaded sleeve 19 attached to platform 12 to translate platform 12 in the y direction as y shaft 15 and gears 16 and 17 rotate. Stationary y motor 15A drives y shaft 15 through rotary vacuum seal 15B.

Figure 2:
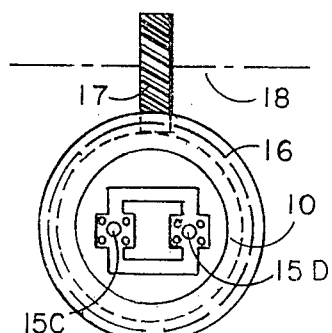
FIG. 2 is a diagrammatic cross-sectional view of the gear housing of FIG. 1.

Referring to FIG. 2, there is shown a diagrammatic cross sectional view generally through section 2—2 of FIG. 1. Housing 10 may both translate and rotate. Housing 10 is coupled to shaft 15 of generally I cross section by ball and rod couplings 15C and 15D. Thus, as support 13 translates along the x direction, housing 10 translates in the same direction along shaft 15 with virtually zero friction inside the vacuum chamber bounded by housing wall 11. Therefore, this translation does not affect the x motion or position because there is no slop in the ball and rod couplings 15C and 15D.

Shaft 15 and y motor 15A do not translate, and a rotary seal 15B may be used at wall 11 to maintain a good vacuum seal without introducing drag or frictional forces affecting x motion.

Briefly reviewing principles of the invention, the sliding action occurs inside the vacuum environment by attaching the driver helical gear 16 to housing 10 which incorporates the means to permit driving helical gear 16 to translate in x while allowing it to rotate while engaging orthogonal driven helical gear 17 that drives feed screw 18 to translate table 12 in the y direction. Yet, the heat, bulk and magnetic fields of y motor 15A remain outside housing 11. Another advantage of the invention is that the driving means for positioning in both x and y directions remains in one quadrant of the housing to free the remaining three quadrants for receiving other system elements used in the system.

Figure 3:
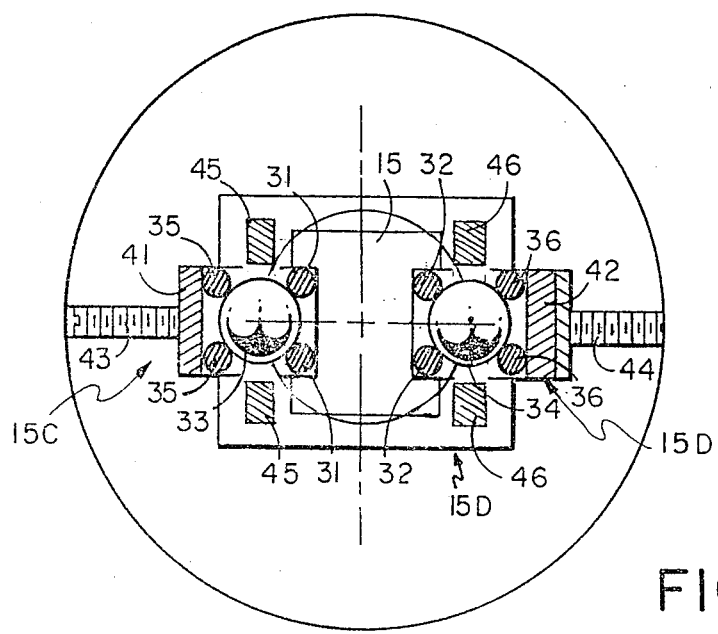
FIG. 3 is a diagrammatic sectional illustration of a cross section of housing and shaft helpful in understanding the coupling between slidable housing and the y shaft.

Referring to FIG. 3, there is shown a diagrammatic sectional view of the housing-shaft coupling helpful in understanding the mode of operation. Y drive shaft 15 carries opposed pairs of inside rods 31 and 32 for engagement with balls, such as 33 and 34. Housing 10 carries outside pairs of rods 35 and 36 for engagement with balls, such as 33 and 34, respectively. Housing 10 is formed with diametrically opposed recesses for accommodating backing plates 41 and 42 for engagement with outside pairs of rods 35 and 36, respectively. Housing 10 is also formed with tapped openings for accommodating adjustment screws 43 and 44 to insure firm contact of the balls and rods and establish a desired preload to centrally align the axis of motion. The balls, such as 33 and 34, ride between pairs of separators 45 and 46, respectively.

Figure 4:
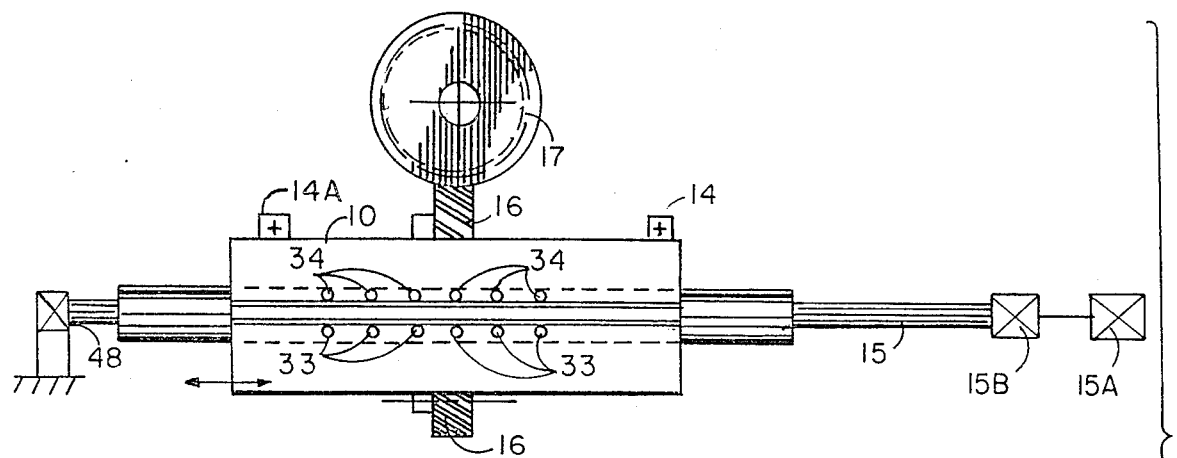
FIG. 4 is a diagrammatic representation of the right angle drive assembly in front elevation helpful in better understanding the mode of operation.
Figure 4:
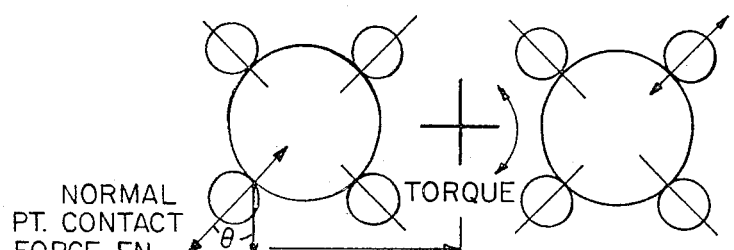

Referring to FIG. 4, there is shown a diagrammatic front elevation view helpful in understanding the structural arrangement. There are a number of axially displaced pairs of balls 33 and 34. There are a number of pairs of balls sufficient to transmit the required torque to rotate helical driving gear 16. The inside end of shaft 15 is supported in a bearing 48 inside the evacuating chamber bounded by housing wall 11.

Figure 5:
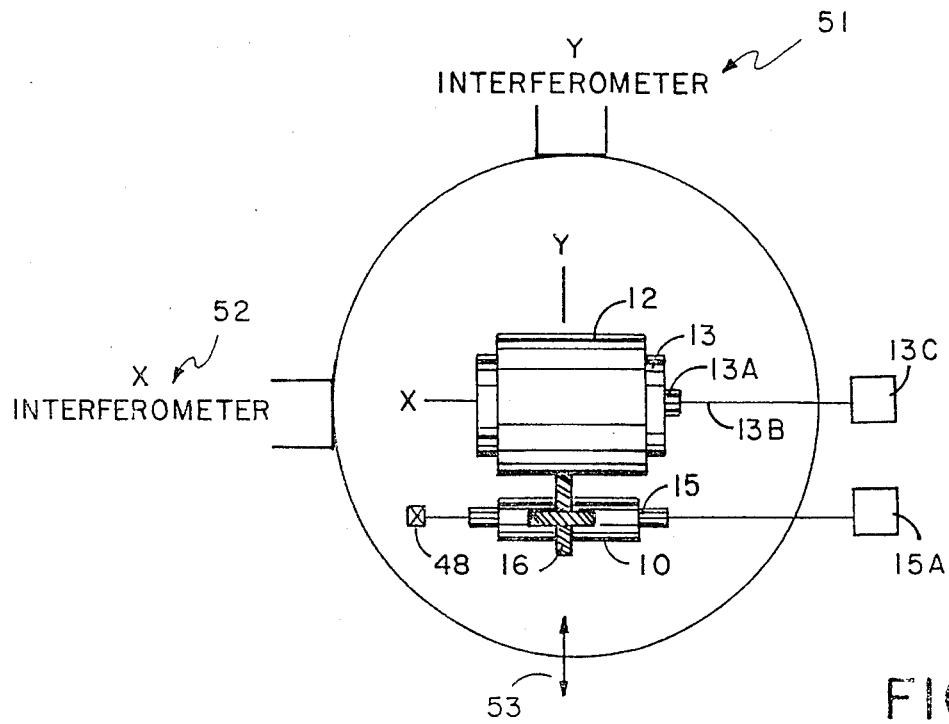
FIG. 5 is a diagrammatic plan representation of the evacuated housing illustrating the relationship among system components in the different quadrants.

Referring to FIG. 5, there is shown a diagrammatic representation of the full housing helpful in understanding the advantages achieved by having the positioning mechanism in one quadrant. With the table positioning mechanism substantially at 3:00, the y interferrometer 51 for detecting the y position of table 12 and the x interferrometer 52 for detecting the x position of table 12 may be located substantially at 12:00 and 9:00, respectively. Substrate ingress and egress 53 may be located at 6:00.

Figure 6:
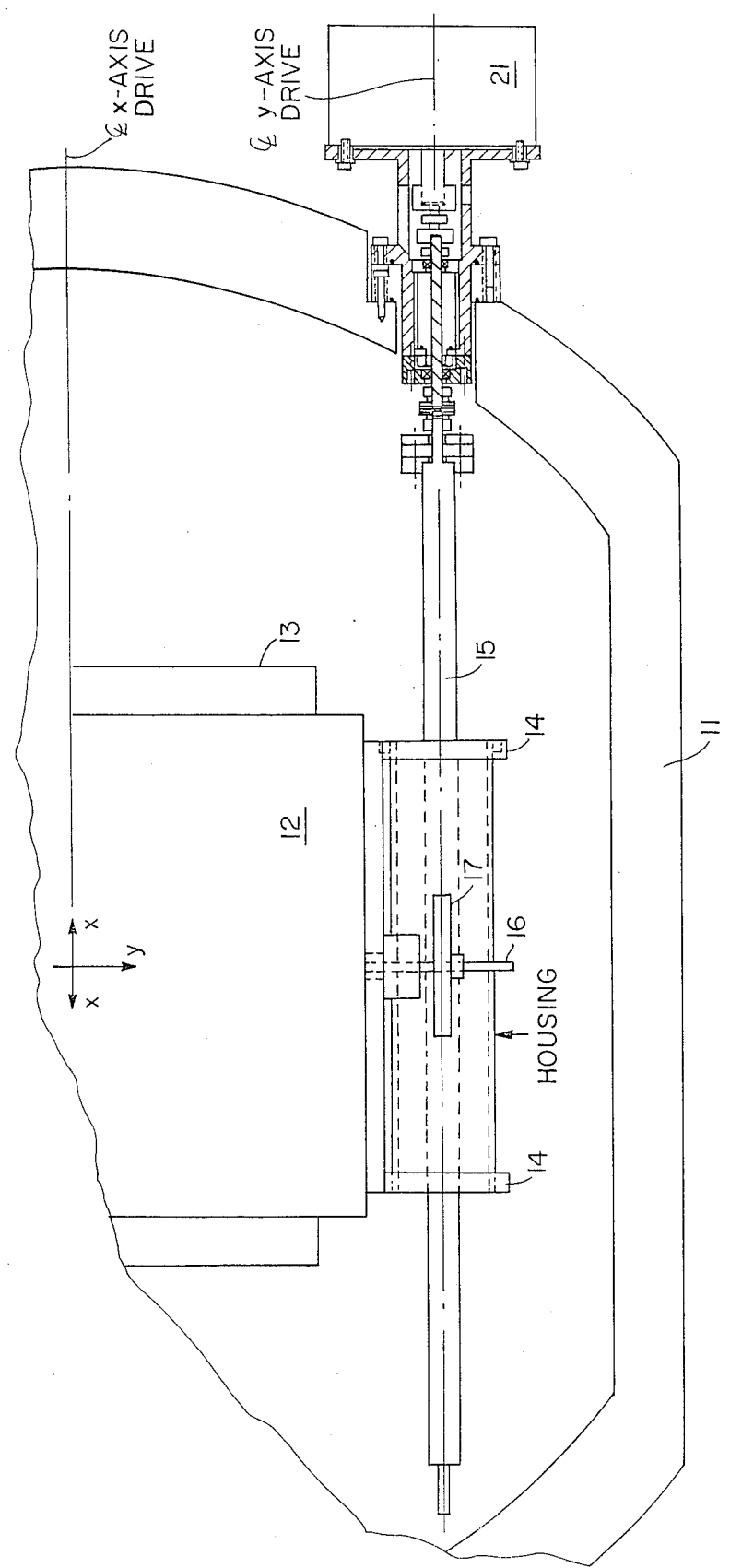
FIG. 6 is a fragmentary plan view partially in section of an embodiment of the invention.
Figure 7:
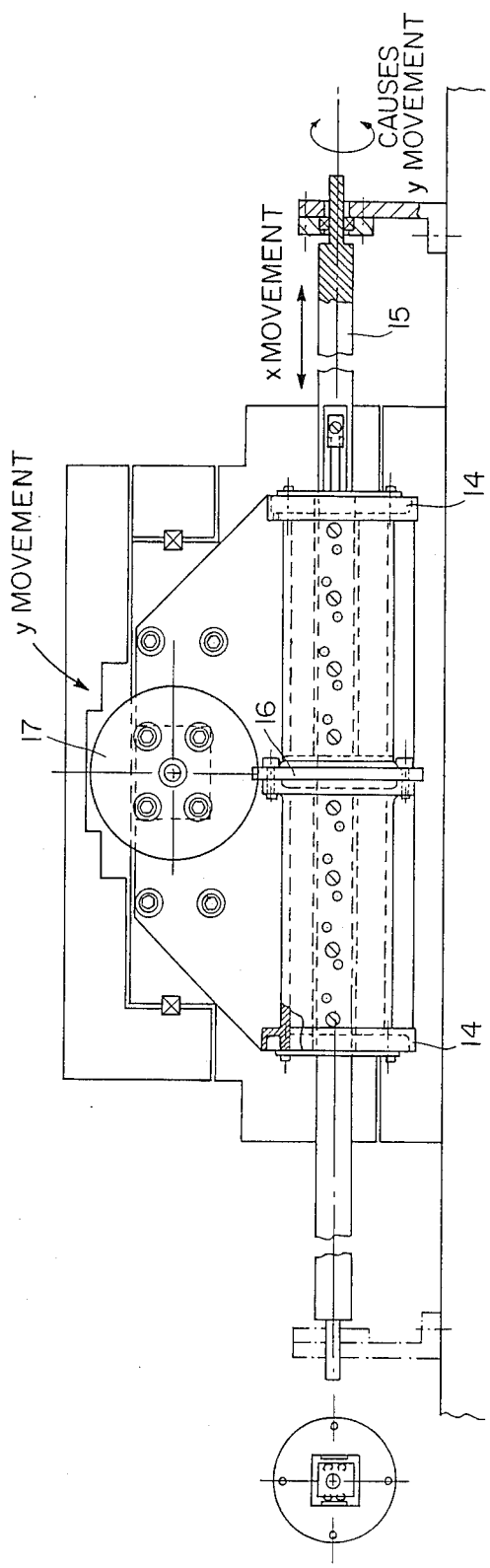
FIG. 7 is a fragmentary front elevation view partially in section of an embodiment of the invention.
Figure 8:
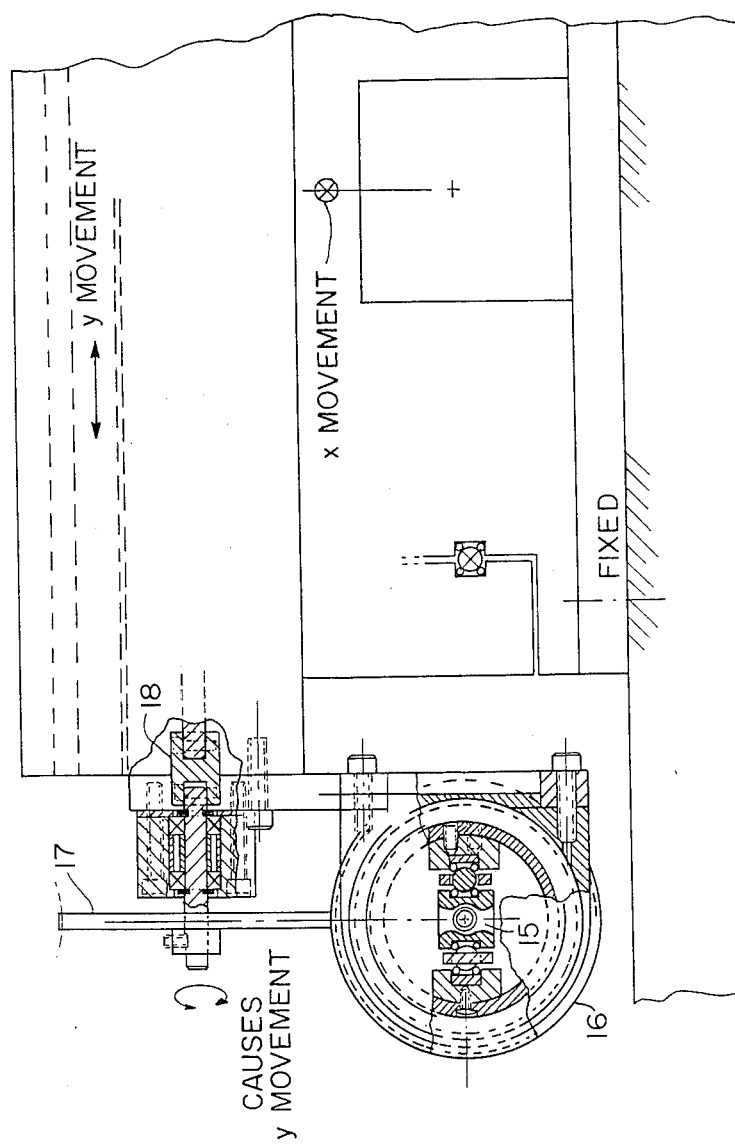
FIG. 8 is a fragmentary side elevation view partially in section of an embodiment of the invention.

Referring to FIGS. 6, 7, and 8 there are shown fragmentary plan, front and side views, respectively, partially in section of a working embodiment of the invention showing the right angle drive portions while omitting the x portions. The same reference symbols used in FIGS. 1 and 2 identify corresponding elements in FIGS. 6–8.

There has been described novel right angle drive apparatus and techniques especially useful in connection with positioning a platform in a vacuum chamber. It is evident that those skilled in the art may now make numerous uses and modifications of and departures from the specific apparatus and techniques herein disclosed without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Right angle drive apparatus for driving in a second direction a first member movable in a first direction substantially perpendicular to said second direction comprising, said first member, a second member movable along said first direction, means for slidably supporting said first member on said second member allowing translation of said first member relative to said second member in said second direction, drive shaft means rotatable about and stationary along a first axis along said first direction for providing mechanical energy to drive said first member along said second direction, and transmission means for converting rotating movement of said drive shaft means to rotating movement about a second axis along said second direction for providing driving power to said first member translating said first member along said second direction, wherein said transmission means comprises a first helical gear slidably mounted on said drive shaft means and a second helical gear meshing with said first helical gear and rotatable about said second axis.

2. Right angle driving apparatus in accordance with claim 1 wherein said transmission means comprises a rotatable housing rotatable about and slidable along said first axis, said first helical gear being secured to said rotatable housing.

3. Right angle driving apparatus in accordance with claim 2 wherein said transmission means further comprises rod and ball coupling means for coupling said rotatable housing to said drive shaft means for maintaining said rotatable housing and said drive shaft means relatively movable along and relatively stationary about said first axis.

4. Right angle driving apparatus in accordance with claim 3 wherein said drive shaft means comprises a member of generally I cross section formed with opposed channels having opposed inside pairs of rods, said rotatable housing having opposed pairs of outside rods, and balls sandwiched between adjacent pairs of inside and outside rods.

5. Right angle drive apparatus in accordance with claim 1 and further comprising, an evacuated housing, said first and second members and said transmission means being located in said evacuated housing, a first electrical motor outside said evacuated housing for rotating said drive shaft means, first vacuum seal means through which said drive shaft means passes for connection to said first electric motor for establishing a vacuum seal between the inside and outside of said evacuated housing, said first electric motor being stationary along said first axis.

6. Right angle drive apparatus in accordance with claim 5 and further comprising, a second electric motor outside said evacuated housing having a second electric motor axis along said second direction, lead screw means along said first direction having a lead screw axis spaced from said first axis coupled to said second member for coupling rotating movement of said second electric motor to movement of said first and second members along said first direction, and second vacuum seal means through which said lead screw means passes for establishing a vacuum tight seal between the inside and outside of said evacuated housing.

7. Right angle drive apparatus in accordance with claim 6 wherein said evacuated housing is characterized by a housing axis perpendicular to the plane of said first and second axes, said first and second electric motors being located in a first quadrant of the circular region around said housing axis.

8. Right angle drive apparatus in accordance with claim 7 and further comprising, first and second position sensing means for providing signals representative of orthogonal coordinates of said first member, said first and second position sensing means being located in second and third quadrants about said housing axis different from said first quadrant.

9. Right angle drive apparatus in accordance with claim 8 and further comprising, ingress/egress means in said housing including means defining a selectively closable opening for allowing entry and exit of elements to be processed inside said evacuated housing located in a fourth quadrant about said housing axis different from said first, second and third quadrants.

* * * * *